Patent …

United States Patent [19]
Lee et al.

[11] Patent Number: 4,707,673
[45] Date of Patent: Nov. 17, 1987

[54] DIRECTIONAL COUPLING TRANSFORMER FOR BI-DIRECTIONAL FULL DUPLEX DATA BUS

[75] Inventors: Kyong Lee, Albuquerque; Robert H. Maschhoff, Cedar Crest, both of N. Mex.

[73] Assignee: Gulton Industries, Inc, East Greenwich, R.I.

[21] Appl. No.: 872,546

[22] Filed: Jun. 10, 1986

[51] Int. Cl.⁴ .............................................. H03H 7/48
[52] U.S. Cl. .................................. 333/112; 333/119; 379/378
[58] Field of Search ......................... 333/112, 119, 131; 370/24; 455/15; 379/93, 97, 98, 377, 378, 442

[56] References Cited

U.S. PATENT DOCUMENTS

| | | | |
|---|---|---|---|
| 2,734,169 | 2/1956 | Douma | 333/112 X |
| 4,274,051 | 6/1981 | Condon | 379/378 X |
| 4,467,293 | 8/1984 | Apel | 333/112 |
| 4,555,681 | 11/1985 | Dominick et al. | 333/119 X |

Primary Examiner—Paul Gensler
Attorney, Agent, or Firm—Darby & Darby

[57] ABSTRACT

A directional coupler transformer insensitive to data bus termination failures, includes a ferrite toroid core about which first through fourth windings are wound, the first and second windings being for connection in series with each conductor, respectively, of a data bus for sensing or generating data signal current, the third winding being connected in parallel with the data bus conductors for sensing or generating data signal voltage, and a fourth winding inductively coupled to the other three windings for either coupling data signals traveling in one direction from the data bus to a receiving unit, or coupling data signals from a transmitting unit to the data bus for transmission along the data bus in a given direction.

16 Claims, 11 Drawing Figures

: 
DIRECTIONAL COUPLING TRANSFORMER FOR BI-DIRECTIONAL FULL-DUPLEX DATA BUS

FIELD OF THE INVENTION

The field of the present invention relates generally to coupling transformers for data buses, and more specifically relates to such transformers for providing bi-directional communication along a data bus of units coupled thereto.

BACKGROUND OF THE INVENTION

Coupling systems for permitting a number of receiver/transmitter units to communicate along a common data bus are well known in the art. For example, in telephony hybrid transformers are used along a telephone systems cable lines in a two-wire communication system for providing directional coupling between telephone sets. The hybrid transformers typically used in telephony provide bi-directional communication if two terminals in the communication system are connected at the far ends of a common cable. If a third terminal is connected to the communication line between the other two terminals at the extremes of the cable, and the other two terminals are each simultaneously transmitting signals down the line in opposite directions, the third terminal will receive a signal that is a mixture of the signals being transmitted by the other two terminals, and as a result will be unable to decipher or receive information from either of the other two terminals unless the signals are time displaced, phase displaced, or in some other way made electrically different to permit detection by a third terminal from the common transmission line. The typical telephony hybrid couplers must have a balanced network to operate in proper termination, whereby if along a common telephone cable an open circuit or short circuit occurs, the telephony hybrid couplers cannot provide communication for terminals connected to the cable system upstream of the failure point in the cable.

Directional couplers are also known in the art for use in microwave transmission systems. However, microwave directional couplers by necessity use wave guide techniques that are not practical in the frequency range of 100 KHz to 10 MHz, where coaxial cables or twisted shielded cables serve as the transmission media or data bus for data signals.

Also, it is known to use data bus systems as defined in MIL-STD-1553B in aerospace instrumentation systems for digital data transmissions between units on a common data bus. Such systems provide for protection against short circuits occurring in remote units or transformers connected to the bus, no protection is provided against cable termination failures, whereby an open or short circuit failure anywhere along the main cable bus causes the entire bus system to fail.

SUMMARY OF THE INVENTION

An object of the invention is to permit data signals to be simultaneously transmitted in opposite directions along a common transmission cable or data bus, while permitting remote units and a main unit coupled to the transmission line or data bus to receive one of the signals without interference from the other signal on the line, or to transmit one of the signals without interference with the other signal on the line.

Another object of the invention is to provide communication in the half-duplex mode between terminals or remote units located upstream of a failure point along a transmission line or data bus.

Yet another object of the invention is to provide for the bi-directional transmission of data along a data bus having a master unit and a plurality of N remote units connected along the data bus, whereby N is any integer number including 1 (N=1, 2, 3, 4 . . . ).

Another object of the invention is to provide a bi-directional coupling transformer for permitting data to be bi-directionally transmitted along a data bus in the frequency range of 100 KHz to about 10 MHz, between a master unit and remote units connected to the data bus.

Another object of the invention is to provide a bi-directional coupling transformer for permitting the bi-directional transfer of data between a plurality of terminals connected to a data bus, with very low signal loss.

With these and other objects of the invention in mind, the present invention includes coupling transformer means for coupling individually the transmitting and receiving subsystems of a communication unit to a data bus, in a multi-unit system, wherein for each receiving or transmitting unit the bi-directional coupling transformer means further includes first and second ports which are connected to the transmission line, and a winding means for connection to the appropriate receiving or transmitting unit of the communication units to be coupled to the data bus or transmission line.

With these and other objects in mind, the present invention includes bi-directional coupling transformer means including a common toroid core, a first winding for connection between the two conductors of a data bus or transmission line, second and third windings for connection in series with the two individual conductors of the data bus or transmission line, respectively, and a fourth winding for connection to a data communication unit, whereby individual ones of the directional coupling transformer means are similarly provided for connecting each one of the communicators or units in the data communication system to the data bus or transmission line, thereby providing for bi-directional data communication between the individual communication units connected to the data bus, each one of the units being either a data transmitter or data receiver.

BRIEF DESCRIPTION OF THE DRAWINGS

The present invention will be described with reference to the accompanying drawings, wherein like items are indicated by the same reference designation.

DESCRIPTION OF THE PREFERRED EMBODIMENTS OF THE INVENTION

Figure 1:
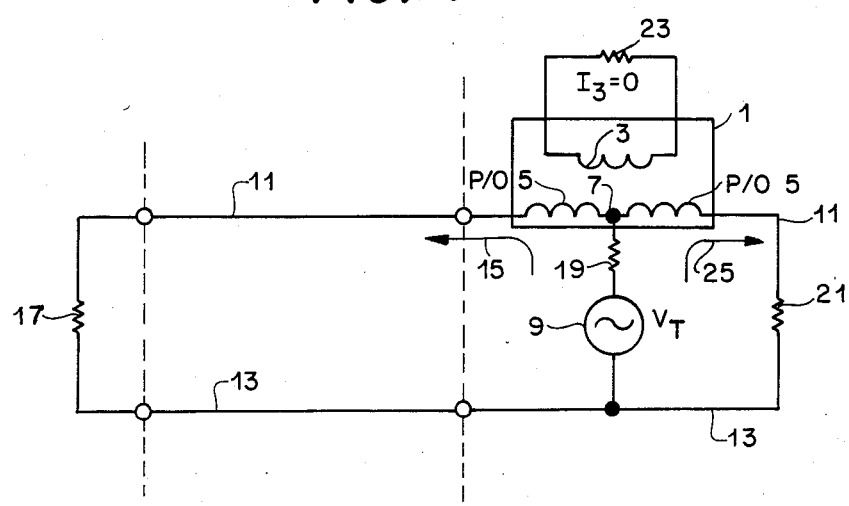
FIGS. 1 and 2 show schematic diagrams of typical telephony hybrid circuits connected in a transmitting mode of operation, and alternatively in a receiving mode of operation, respectively.
Figure 2:
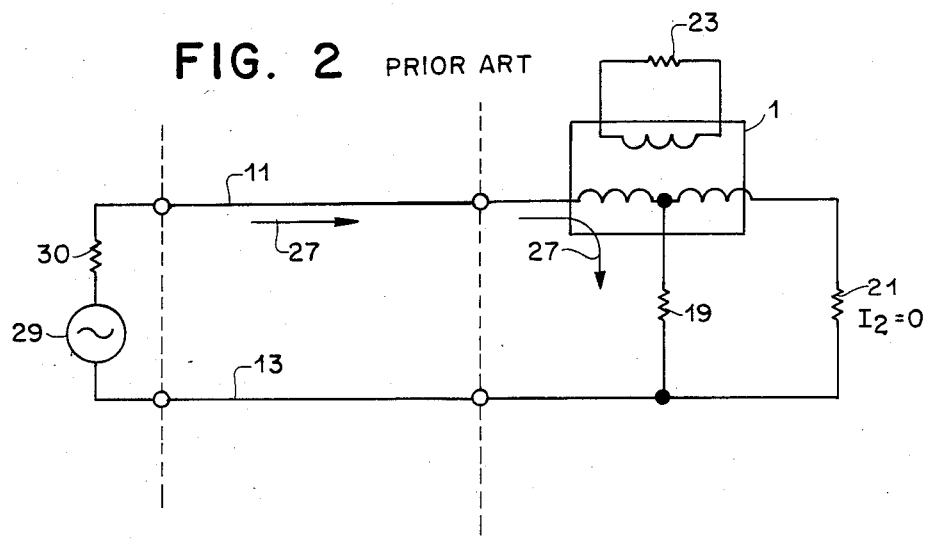

Prior to discussing the various embodiments of the invention, it would be useful to first review the characteristics of a number of signal couplers provided in the prior art. With reference to FIGS. 1 and 2, showing hybrid circuits for use as typical telephone hybrid couplers, wherein the hybrid transformer 1 includes two windings 3 and 5, with winding 5 being a centertapped winding having a tap at connection point 7. With further reference to FIG. 1, assume that a transmitter 9 is operated to produce a signal voltage $V_T$, as shown. As a result, a current $I_1$ will flow in the direction of arrow 15 through a conductor 11 of a transmission cable, a load impedance 17, and through another conductor 13 of the transmission cable back to the transmitter 9. Note that the signal current $I_1$ in this example also flows through the one-half of winding 5. Also, transmitter 9 producing a signal voltage $V_T$ causes a current $I_2$ to flow in the opposite direction of $I_1$, as shown by arrow 25. Current $I_2$ flows through resistor 19, the other half of the centertapped winding 5, through a balance resistor 21, and then returns to the transmitter 9 via conductor 13 of the transmission cable. The impedance of a receiving unit is represented by the resistor 23. Assume that any current flow through the receiver impedance 23 is designated as $I_3$. If the termination impedance of resistor 17 is equal to the value of the balance resistor 21 connected at the other end of the transmission cable 11, 13, then transmitted signal current $I_1$ will be equal to the magnitude of the oppositely flowing signal current $I_2$, causing the current $I_3$ at the receiver load impedance 23 to be equal to zero. In other words, no current will flow through the receiver load. Since the transmitted signal current is divided equally between the cable termination or equivalent resistance or impedance 17, and balance resistor 21, the loss of the illustrated hybrid transformer is 3 dB.

Figure 3:
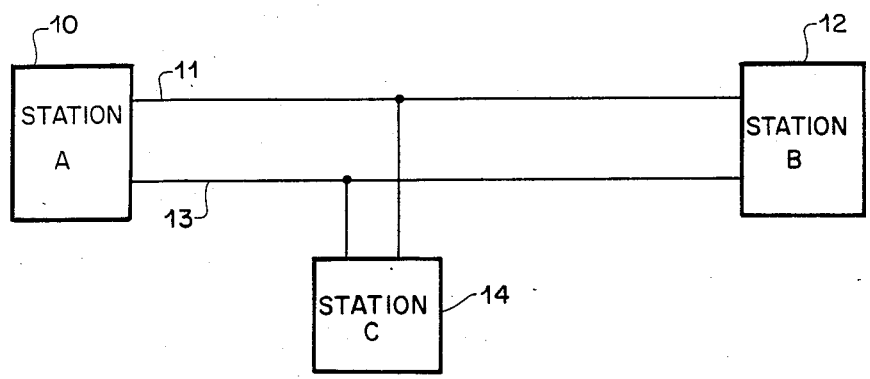
FIG. 3 shows a block diagram of three stations in typical connection to a transmission or data bus line.

With reference to FIG. 2, when the hybrid transformer 1 receives an incoming signal represented by the current $I_1$ flowing in the direction of arrow 27, produced by a signal generator 29 in series with resistor 30 connected at one end of the transmission cable 11, 13, as shown, the resistor 19 is equal in impedance or resistance to the reflective load resistance represented by the resistance of the receiver resistor 23 divided by the square of the number of turns on transformer winding 3, the transformer 1 produces no current ($I_2=0$) at the balance resistor 21. The power delivered into the hybrid circuit 1 will then divide equally between the resistor 19 and the receiver resistance 23, thereby again producing a loss of 3 dB. The transmitting and receiving operations illustrated in FIGS. 1 and 2 can be simultaneously performed by a use of the illustrated hybrid circuit 1, which enables bi-directional transmission through a single pair of wires 11, 13. However, the hybrid transformer or circuit 1 is functionally limited, in that if more than two Stations are connected to the transmission cable 11, 13, as shown in FIG. 3 (Stations A, B, and C referenced as items 10, 12, 14, respectively, are shown connected to the transmission cable 11, 13), and if Stations A and B, for example, transmit simultaneously, Station C will receive a mixed signal of the transmitted signals from Stations A and B, assuming the hybrid transformer 1 is in use for connecting the stations to the transmission cable 11, 13, thereby preventing Station C from receiving either message in an intelligible manner.

Figure 4:
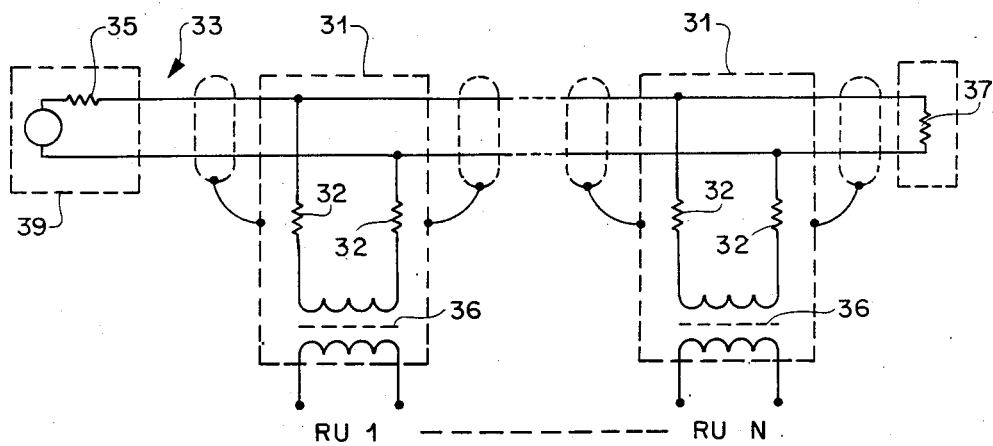
FIG. 4 shows a typical circuit schematic diagram for a MIL-STD-1553B data bus interfaces.

MIL-STD-1553B data bus interfaces 31 are connected as shown in FIG. 4 to a data bus 33, whereby the data bus or cable 33 is terminated at both ends by its characteristic impedance $Z_0$ represented by resistors 35 and 37. Each interface 31 includes resistors 32 and a transformer 36. Assume that a master unit 39 (known as an MU) is connected at the left-hand side of the cable 33. A problem with the interfaces 31 is that any failures in the system such as a shorted interface, or a short in the cable at some point, will cause the entire data bus represented by the transmission cable 33 to become unstable. For example, ports or connection points upstream of a short in the data bus or cable 33 will not operate properly because of multiple reflections of electrical signals on the line caused by the short.

Figure 5:
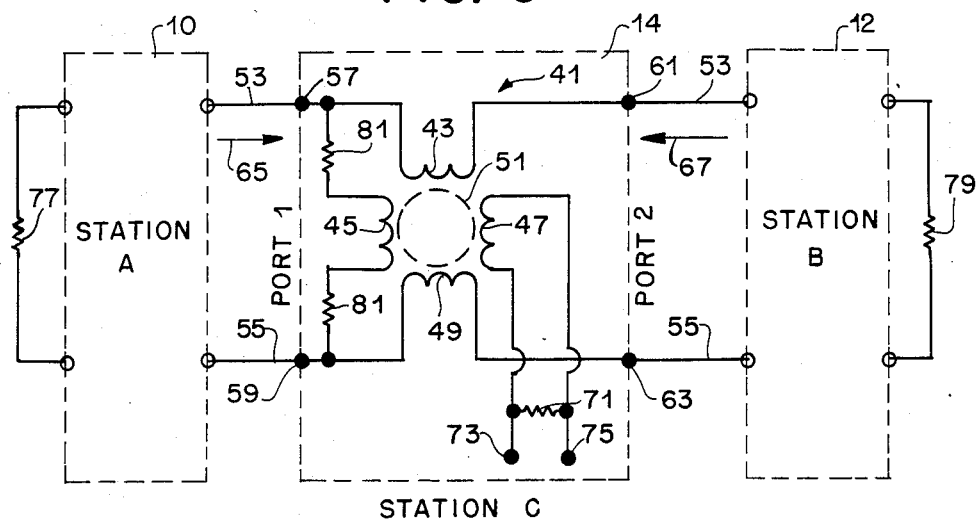
FIG. 5 shows a circuit schematic diagram of one embodiment of the present invention included in a data bus interface circuit.

The present invention provides in one embodiment, as shown in FIG. 5, a directional coupling transformer 41, that overcomes the problems discussed above in telephony and MIL-STD-1553B transmission coupling systems. Unlike the prior art interfaces 31, and telephony hybrid transformers 1, the present invention includes a directional transformer 41 having four windings 43, 45, 47, and 49, in this example wound about a ferrite toroid core 51. Also, this unique combination provides for two "port" coupling of the inventive transformer 41 to the data bus or transmission linen 53, 55. Winding 45 is connected between terminals 57 and 59, for providing Port 1, for connection to cable data bus conductors 53, 55, respectively, as shown. The other side of the transmission cable or data bus 53, 55 is connected to Port 2 via terminals 61 and 63. Windings 43 and 49 are connected between terminals 57 and 61, and terminals 59 and 63, respectively, as shown. Each winding 43, 49, has $N_1/2$ turns, the sum of which is $N_1$ turns. The fourth winding 47 provides either an output voltage for a reception of a transmitted signal from either Station A or Station B, or for transmitting a signal to the stations, as will be discussed below. Winding 47 has $N_3$ turns. As shown in FIG. 5, Stations A and B are each transmitting signals represented by arrows 65 and 67, respectively, towards the directional coupler 41 at Station C. The relative polarity of current sensing windings 43 and 49 to voltage winding 45 as connected in the directional coupler 41, will determine whether the received data signal voltage $V_o$ developed across resistor 71 is representative of the transmitted signal from Station A or from Station B. A switching circuit, not shown, can be installed in the directional coupler 41 for permitting selection of the polarities of windings 43 and 49, relative to winding 45, for receiving either the transmitted signal from Station A or from Station B, at Station C. With Station C in the receive mode, the received signal is represented by $V_0$ at terminals 73 and 75 of the directional coupler 41. Note that impedances 77 and 79, each have an impedance equal to $Z_o$ ohms, which is the characteristic impedance of the cable 53, 55 or data bus 53, 55. Winding 45, having $N_2$ turns, is terminated or connected to the transmission cable or data bus 53, 55 via two resistors 81, in this example, each having a resistance designated by $R_2/2$ ohms (each resistor 81, in this example, represents half of the resistance of a resistor value of $R_2$ ohms). Resistor 71 has a resistance value of $R_3$ ohms.

Figure 6:
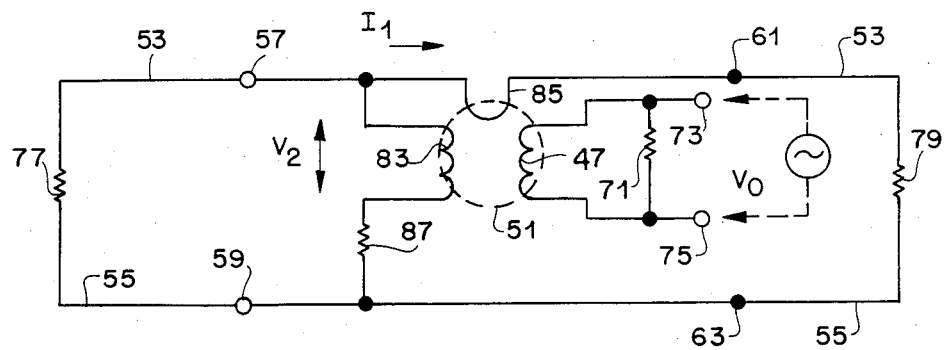
FIG. 6 shows an equivalent circuit schematic diagram of the one embodiment of the invention of FIG. 5.

The equivalent circuit for the directional coupler circuit of FIG. 5 is shown in FIG. 6. The equivalent circuit permits simpler analysis of the relative circuit parameters required ot obtain a desired operational characteristic or characteristics for the present directional coupler 41. The inventors provide a very detailed analysis of the present directional coupler circuit in a paper entitled "New Data Bus Interface Technique", published on June 18, 1985, in the IEEE Transactions on Aerospace and Electronic Systems, Vol. AES-21, No. 3, May 1985. This analysis shows that there is a benefit from making the turns ratio for windings 83 and 85 ($N_2/N_1$) equal to the ratio of the sum of resistor 87 plus the characteristic impedance of the $Z_0$ of the transmission cable 53, 55 divided by the characteristic impedance $[(R_2+Z_o)/Z_o]$. Note that $N_1$ is the sum of the turns of windings 43 and 49 represented by equivalent winding 85; winding 83 represents the equivalent of winding 45 of $N_2$ turns; and $R_2$ is the sum of the resistances of resistors 81 equivalent to resistor 87. If the latter ratios are so equated, the current $I_1$ due to the transmitted signal from Station A (see FIG. 5), flowing through windings 43 and 49 will cause a voltage $V_I$ to be induced into winding 47 (designated as having a number of turns $N_3$) that will be equal in amplitude to another voltage $V_v$ induced in winding 47 via the signal voltage developed across winding 45 (note that this winding has $N_2$ turns). However, the polarity of the current induced voltage $V_I$ is determined by the direction of the current $I_1$, whereby the sum of the latter with the voltage $V_v$ provides the voltage $V_o$ developed across terminals 73 and 75. Note that the polarity of the current induced voltage $V_I$ is determined by the direction of the current, whereby the sum of the two induced voltages is additive from one directional signal 65 and subtractive for the other 67. When Station C is operated as a transmitter, the transmitting voltage signal therefrom is applied across terminals 73 and 75 (across winding 47). The transmitted signal will be induced into winding 45 (the voltage winding), which winding will produce two directional currents, one flowing to the left toward impedance 77 and the other flowing to the right toward impedance 79, in conductors 53, for example. Also, a portion of the transmitted signal will be induced into the current winding 85, which winding will only produce current flowing in one direction, whereby the current winding 85 induced current cancels one of the currents produced by the voltage winding 83. In this manner, a uni-directional transmission current is produced. The selection of the transmission direction is determined by the relative polarities of the current windings 43 and 49, to the voltage winding 45. Also, if the previously mentioned transformer turns ratio and impedance ratio are as indicated, when Station C is in a receiving mode, the received signal voltage developed across the resistor 71 (also across winding 47) is made insensitive to cable terminations or reflections occurring along the data bus or transmission cable 53, 55.

Figure 7:
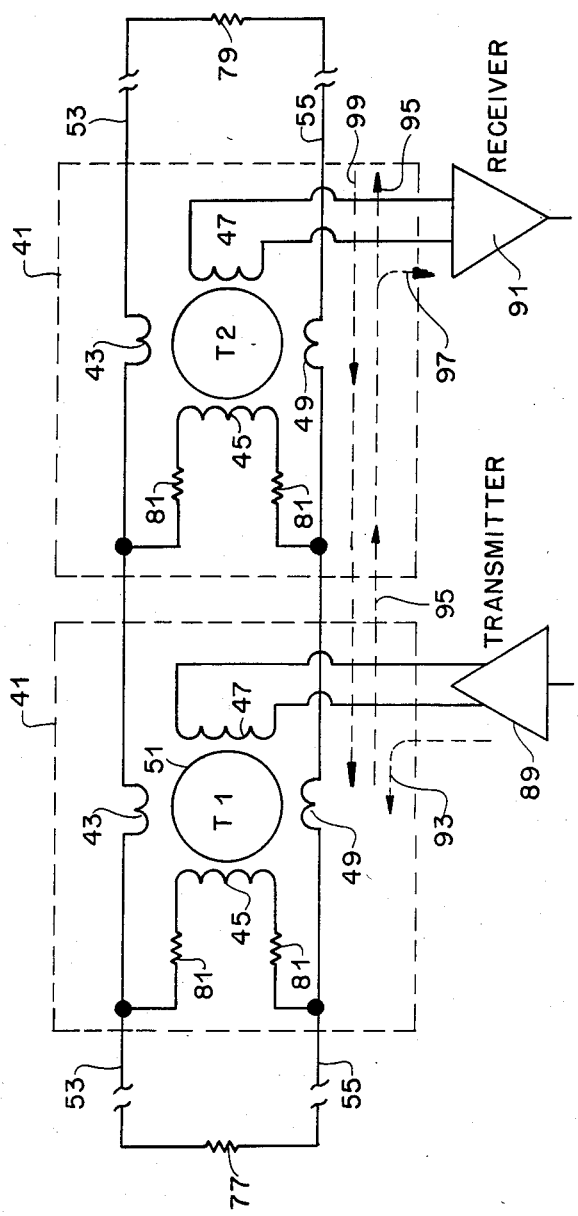
FIG. 7 shows a circuit schematic diagram of another embodiment of the invention included in a data bus transmission system for connecting transmitting and receiving units to the system for bi-directional communication in the system.

As shown in FIG. 7, a pair of directional couplers 41 can be included along a data bus or cable 53, 55 for permitting a transmitter unit 89 and receiver unit 91 to be coupled to the data bus cable 53, 55. The directional coupling transformers 41 provide for the transmitter to transmit a data signal, for example, in the direction of arrow 93 down the data bus cable 53, 55, while simultaneously permitting transmitted signals to flow down the data bus cable 53, 55 from the extreme right-hand portion of the bus 53, 55, and other data signals to flow from the extreme left-hand portion of the data bus 53, 55 in the direction of arrow 95, whereby a portion of these data signals are received by the receiver 91 via its associated directional coupler 41, as indicated by the arrow 97.

Figure 8:
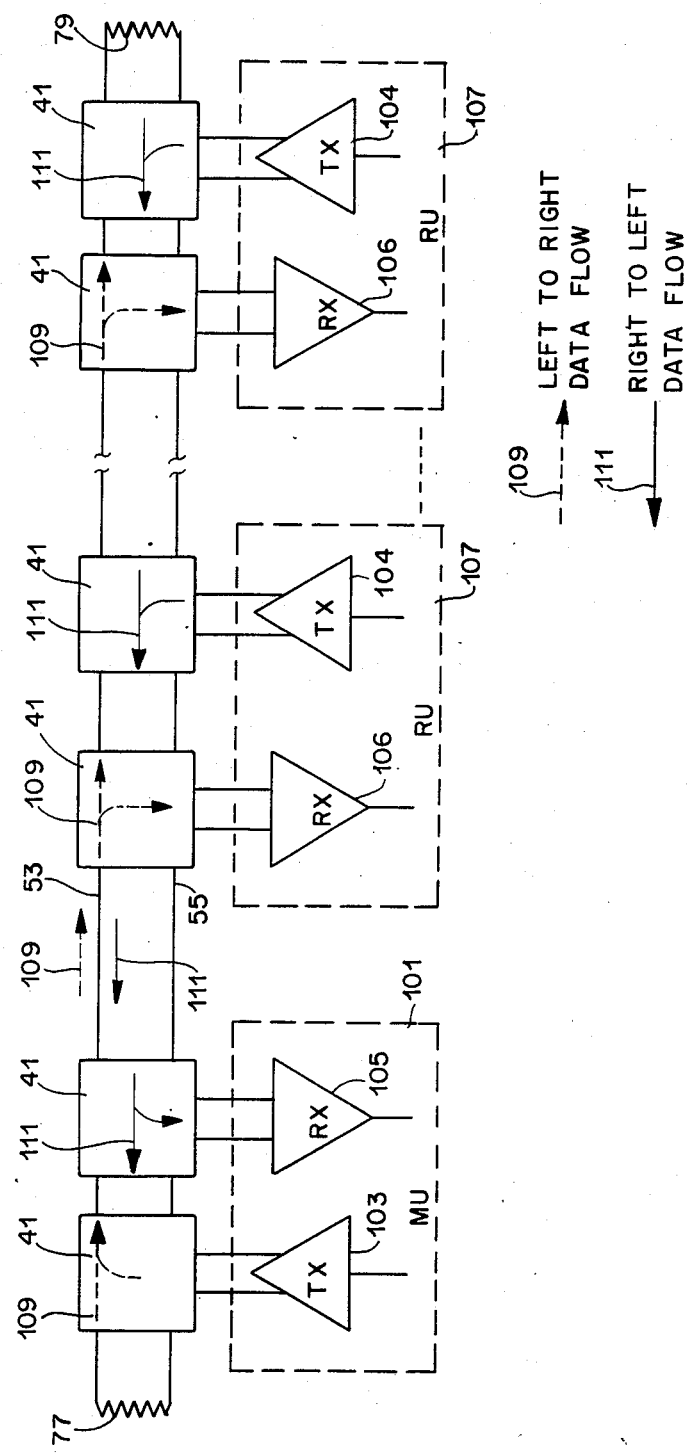
FIG. 8 shows a block schematic diagram of yet another embodiment of the invention for a bi-directional full duplex data bus system.

The use of the present directional coupling transformers 41 can be further extended from the use shown in FIG. 7, whereby as shown in FIG. 8 such directional coupling transformers 41 are used for coupling a Master Unit (MU) 101 including a transmitting unit 103 and receiving unit 105, and a plurality of N remote units 107 to the data bus cable 53, 55, where N is an integer number 1, 2, 3 . . . , n, for permitting the bi-directional flow of data along the data bus cable 53, 55 as shown by the arrows 109, 111. In this example, communication would be between the MU 101 and the RU's 107.

As previously mentioned, the present inventors published an article on June 18, 1985, entitled "New Data Bus Interface Technique", in IEEE TRANSACTIONS ON AEROSPACE AND ELECTRONIC SYSTEMS, Vol. AES-21, No. 3, May 1985, which is incorporated herein by reference in its entirety. As mentioned, the article provides a detailed mathematical analysis of the present directional coupler. Also, in Section IV, entitled "EXPERIMENTAL RESULTS", the inventors discuss a breadboard data bus system they constructed to verify the performance of the present invention. As described, the bread board data bus system included five interface circuits with a total length of 85 feet of twisted, shielded-pair cable. A cable having an impedance of 70 ohms was used, and the coupling transformers were constructed by using ferrite toroid cores. The termination at the far end of the cable was varied to be either open circuited, short circuited, or terminated to a 70 ohm resistor. The output waveforms from the directional coupling transformers, and the effects on the signals being carried by the cable, were monitored for each cable termination mode. It was observed that the waveforms developed were substantially constant regardless of the termination conditions at the far end of the cable, confirming the operation of the present directional coupler 41. Also, from the mathematical analysis of the directional coupler (See FIG. 5 hereof), it was determined that, as the value of resistors 81 was increased from 100 ohms to 6,000 ohms, lower insertion losses and better impedance matching were obtained for the higher resistance values. However, it was also determined that higher values of resistance for resistors 81 necessitates the use of a higher turns ratio for the number of turns $N_2$ of winding 45 to the sum of turns ($N_1$) of the current windings 43 and 49, respectively, thereby resulting in increased winding capacitance in the voltage winding 45, which reduces the bandwidth of the coupling transformer 41.

Figure 9:
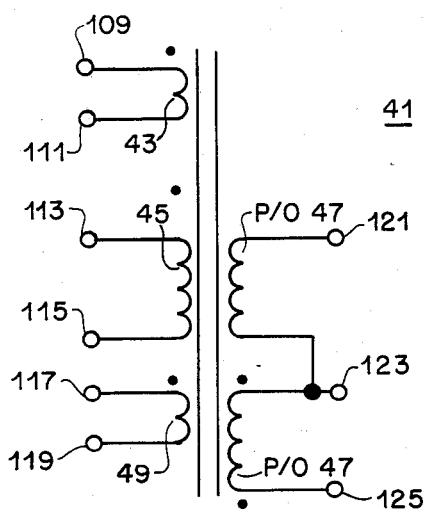
FIG. 9 shows a circuit schematic diagram of a coupling transformer for one embodiment of the invention.
Figure 10:
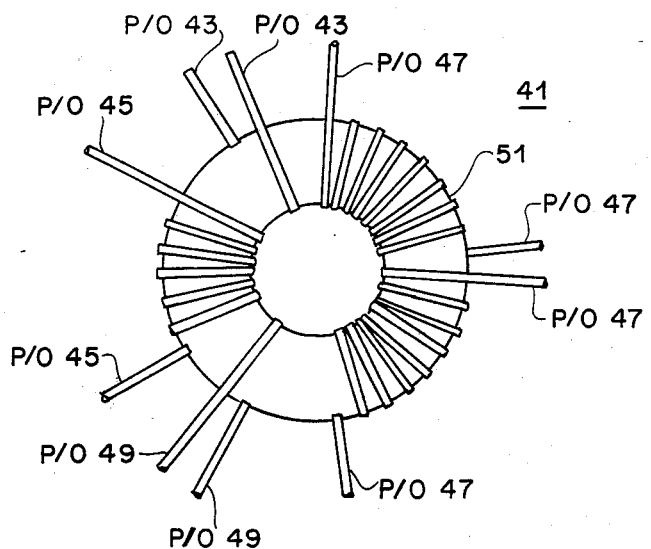
FIG. 10 shows the mechanical construction for winding a coupling transformer for another embodiment of the invention.
Figure 11:
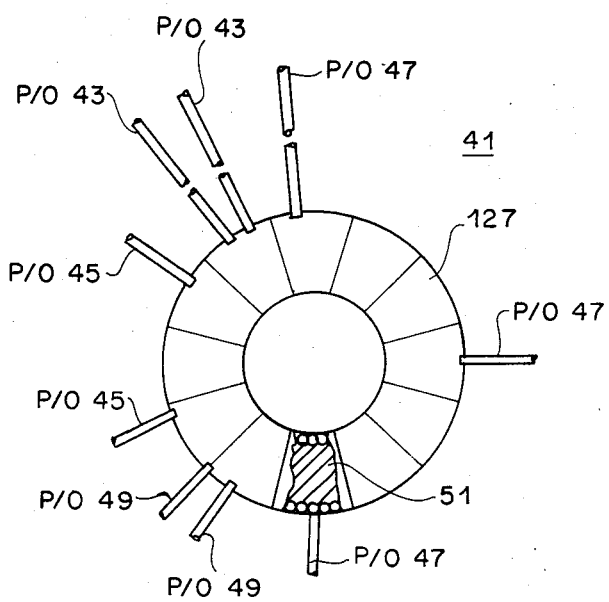
FIG. 11 shows a later fabrication step for producing the transformer of FIG. 10.

A circuit schematic diagram of the present directional coupling transformer 41 is shown in FIG. 9, and represents the configuration or circuit used by the present inventors for engineering prototypes. As shown in FIG. 10, the windings 43, 45, 47, and 49 are in this example wound around a ferrite toroid core 51, as shown. However, although the inventors believe that a toroid core 51 is preferred, other types of transformer cores can be utilized. As shown in FIG. 9, for example, winding 43 terminates at terminals 109 and 111, winding 45 at terminals 113 and 115, winding 49 at terminals 117 and 119, and winding 47 has its extreme ends terminated at terminals 121 and 125, and a centertap at terminal 123. After the transformer is wound as shown in FIG. 10, appropriate insulative tape 127 is would over the windings and the ferrite toroid core 51 as shown in FIG. 11. Note with reference to FIGS. 10 and 11, that the centermost leads of the dual winding 47 shown in FIG. 10 are electrically connected together and terminated at terminal 123, as shown in FIG. 9.

As has been shown above, the present coupling transformer 41 provides for bi-directional communication between units connected to a data bus or transmission cable without regard to cable termination. It also provides for the elimination of false output signals along the data bus or cable due to reflections caused by mismatching, thereby preserving the integrity of the true signal waveforms being conducted along the bus. In applications such as the data bussing for a multi-stage missile, the present invention permits bus operations to continue after staging without providing special termination hardware at the staging interface. Also, the present coupling transformer 41 has the additional advantage that no close matching or tuning is required when installing the coupling transformer 41 into a data bus system.

Although particular embodiments of the present invention have been shown and described herein, such illustrative embodiments of the invention are not meant to be limiting, and variations therefrom are to be deemed within the scope and spirit of the appended claims hereto.

We claim:

1. A directional coupler transformer insensitive to data bus or cable termination failure, for either coupling data signals traveling in a given direction from said data bus to a receiving unit, or from a transmitting unit to said data bus, said directional coupler transformer comprising:
    current sensing means connected in series with said data bus for either sensing data signal current from data signals being conducted by said data bus, or for coupling data signals to said data bus, said current sensing means including first and second windings connected in series with first and second conductors, respectively, of said data bus, the sum of the turns of said windings being $N_1$ turns;
    voltage sensing means connected in parallel with said data bus, for either sensing data signal voltages of data signals being conducted by said data bus, or for coupling data signals to said data bus; and
    coupling means inductively coupled to said current sensing means and said voltage sensing means, for either coupling data signals from said data bus to a receiving unit, or to said data bus from a transmitting unit.

2. The directional coupler transformer of claim 1, wherein said voltage sensing means further includes a third winding of $N_2$ turns connected between said first and second conductors.

3. The directional coupler transformer of claim 2, wherein said coupling means further includes a fourth winding, and said transformer further includes means for inductively coupling said fourth winding to said first through third windings.

4. The directional coupler transformer of claim 3, wherein said means for inductively coupling said first through fourth windings includes a ferrite toroid core about which said windings are wound.

5. The directional coupler transformer of claim 4, further including first and second isolation resistors each having a resistance of R/2 ohms, said first isolation resistor being connected between one end of said voltage winding, and said first conductor, said second isolation resistor being connected between the other end of said voltage winding and said second conductor.

6. The directional coupler transformer of claim 5, further including:
    said data bus having a characteristic impedance of Z ohms, wherein $N_2/N_1$ is made equal to $(R+Z)/Z$, for both ensuring said directional coupler transformer is insensitive to data bus termination failure, and for permitting the relative polarity of said first and second current windings to determine either from which direction data signals are to be received or transmitted relative to said data bus, via said directional coupler.

7. A directional coupler transformer coupling either a digital data receiving unit or a digital data transmitting unit to a bi-directional digital data bus for data signals having first and second conductors, said directional coupler transformer comprising:
    first and second current sensing winding means connected in series with said first and second conductors, respectively, for sensing data signal currents flowing in said first and second conductors, respectively;
    voltage sensing winding means connected between said first and second conductors for sensing the voltage developed by said data signals; and
    coupling winding means inductively coupled to said first and second current sensing winding means and said voltage sensing winding means, for either coupling data signals from said data bus to a receiving unit, or from a transmitting unit to said data bus.

8. The directional coupler transformer of claim 7, wherein said voltage sensing winding means is polarized relative to said first and second current sensing winding means, for either receiving data signals traveling in a given direction in said data bus, or transmitting data signals into said data bus in a given direction.

9. The directional coupler transformer of claim 8, further including a ferrite toroid core, said first and second current sensing winding means, voltage sensing winding means, and coupling winding means being wound about said ferrite toroid core.

10. The directional coupler transformer of claim 8, further including:
    a pair of isolation resistors each having a resistance of R/2 ohms connected in series with and to each end of said voltage sensing winding respectively, between said first and second conductors of said data bus.

11. The directional coupler transformer of claim 10, further having:
    said first and second current sensing winding means each having $N_1/2$ turns;
    said voltage sensing winding means having $N_2$ turns;
    said data bus having a characteristic impedance of Z ohms; and $N_2/N_1$ being equated to $(R+Z)/Z$, thereby providing for said coupling winding means to either (1) couple to a receiver unit induced voltages from said first and second current sensing winding means and voltage sensing winding means for data signals traveling in a given direction along said data bus, or (2) couple data signals from a transmitter to each of the aforesaid winding means for applying said data signals to said data bus in a given direction.

12. A directional coupler installable into either a data bus or transmission cable having first and second conductors for data signals, for permitting the bi-directional flow of data signals betwen at least first, second, and third data receiving/transmitting stations connected thereto, said bi-directional coupler comprising:
    a transformer including:
    first and second winding means connected in series with said first and second conductors, respectively, for sensing data signal currents flowing in said first and second conductors between said first and second stations connected thereto;
    third winding means connected between said first and second conductors for sensing the voltage of the data signals traveling bi-directionally within said first and second conductors; and
    fourth winding means connected to said third station, the combination of said first through fourth winding means providing for coupling data signals transmitted from a selected one of said first and second stations to said third station in a receiving mode, or for coupling data signals from said third station in a transmitting mode to a selected one of said first and second stations in a receiving mode.

13. The directional coupler of claim 12, further including:
    a first isolation resistor connected between said first conductor and one end of said third winding means; and
    a second isolation resistor connected between said second conductor and the other end of said third winding means.

14. The directional coupler of claim 13, wherein said first and second isolation resistors each have a resistance of $R/2$ ohms.

15. The directional coupler of claim 14, wherein said first and second winding means have a sum of $N_1$ turns, said third winding means has $N_2$ turns, and the characteristic impedance of said data bus is Z ohms, whereby the turns ratio $N_2/N_1$ is made equal to $(R+Z)/Z$, for both (1) substantially ensuring said directional coupler transformer is insensitive to data bus termination failure, and (2) permitting the relative polarities of said first through third winding means to determine the direction of data signal flow between said first, second, and third stations.

16. The directional coupler of any one of the preceding claims 12, 13, 14, or 15, further including a ferrite toroid core about which said first through fourth winding means are wound.

* * * * *